United States Patent [19]

Osika

[11] Patent Number: 5,254,941
[45] Date of Patent: Oct. 19, 1993

[54] STRUCTURE AND METHOD FOR DETERMINING ISOLATION OF INTEGRATED CIRCUIT

[75] Inventor: David M. Osika, Somerville, N.J.

[73] Assignee: SGS-Thomson Microelectronics, Inc., Carrollton, Tex.

[21] Appl. No.: 784,259

[22] Filed: Oct. 29, 1991

[51] Int. Cl.$^5$ .......................... G01R 31/02
[52] U.S. Cl. ..................... 324/158 R; 324/719
[58] Field of Search ............. 324/629, 611, 680, 637, 324/638, 639, 158 T, 158 R, 219

[56] References Cited

U.S. PATENT DOCUMENTS

| | | | |
|---|---|---|---|
| 3,707,677 | 12/1972 | Duncan | 324/158 T |
| 3,781,670 | 12/1973 | McMahon, Jr. | 324/158 R |
| 4,347,479 | 8/1982 | Cullet | 324/719 |
| 4,535,307 | 8/1985 | Tsukii | 324/638 |
| 4,626,775 | 12/1986 | Cho et al. | 324/158 R |
| 4,628,144 | 12/1986 | Burger | 324/719 |
| 4,680,538 | 7/1987 | Dalman et al. | 324/630 |
| 4,801,867 | 1/1989 | Suzuki | 324/158 T |
| 4,839,588 | 6/1989 | Jantsch et al. | 324/636 |
| 4,868,494 | 9/1989 | Ryder et al. | 324/637 |
| 4,908,570 | 3/1990 | Gupta et al. | 324/158 T |
| 5,107,207 | 4/1992 | Noyori | 324/638 |

*Primary Examiner*—3
*Assistant Examiner*—Ernest F. Karlsen
*Attorney, Agent, or Firm*—Allan Ratner; Lisa K. Jorgenson; Richard K. Robinson

[57] ABSTRACT

A wafer substrate test structure and method provides a novel means for quantitatively determining electrical isolation between active devices and passive elements in a monolithic integrated circuit. The structure and method of this invention are useful for both optimal design and manufacture of integrated circuit devices.

4 Claims, 3 Drawing Sheets

STRUCTURE AND METHOD FOR DETERMINING ISOLATION OF INTEGRATED CIRCUIT

BACKGROUND OF THE INVENTION

The present invention concerns integrated circuit devices comprising multiple active devices and passive elements on a single die and, in particular, a novel structure and method for determining the degree of isolation between devices and elements.

Monolithic integrated circuits, including both analog and digital circuits, include a multiplicity of both active devices and passive elements formed on a single die. For such circuits to be effective, it is essential that certain structures be electrically isolated from each other over a wide frequency range. For example, monolithic microwave integrated circuits, also known as MMICs, may include a number of transistors with isolated collectors formed on a p-type silicon substrate with epitaxial n+ and n-type silicon layers thereon.

Isolation in the integrated circuit art is typically achieved by forming vertical grooves, or trenches, which may be one-half to two microns wide and six to eight microns deep. Selective interconnection between isolated structures is then accomplished by technique known in the art as "air bridging". An alternate interconnection technique that is finding increasing favor in the art because of its compatibility with planar processing and multi-dimensional structures involves "back filling" of trenches with a suitable dielectric material.

In any event, the effectiveness of the isolation in the prior art has generally been determined by a DC measurement, which fails to predict behavior either at high frequencies or in digital applications, or more commonly, from an assessment of a circuit's performance after complete fabrication, often necessitating costly empirical optimization. Therefore, it is desirable for the designer of both the integrated circuit and the fabrication process to have a quantitative measure of isolation. Such a measure of isolation at the frequencies of interest would permit the selection of materials, dimensions and processing steps for isolation more quickly, more effectively and at lower cost than previously. Moreover, such measure should be capable of being incorporated as a wafer scale quality control tool.

Accordingly, an object of this invention is structure and method for quantitatively determining the electrical isolation between regions on a semiconductor substrate.

SUMMARY OF THE INVENTION

The present invention is embodied in at least two electrically isolated devices formed on a semiconductor substrate. Each device includes in monolithic electrical series connection a first contact pad connected to the substrate by a first substrate contacting means, a matching resistor connected to the substrate by a second substrate contact means to a first resistor contact means, a second contact pad connected to a second resistor contact means. The first and second contact pads of the first device are connected to an electrical signal generator and the first and second contact pads of the second device are connected to an electrical signal analyzer. The values of the matching resistors of each device are selected to match the input and output impedances of the signal generator and of the signal analyzer, respectively.

According to another aspect of this invention, isolation between the structures is determined by applying a signal of selected frequency to the input of the first structure and analyzing the signal detected at the outputs of the second structure using the method of scatter port analysis.

DETAILED DESCRIPTION OF THE INVENTION

Figure 1:
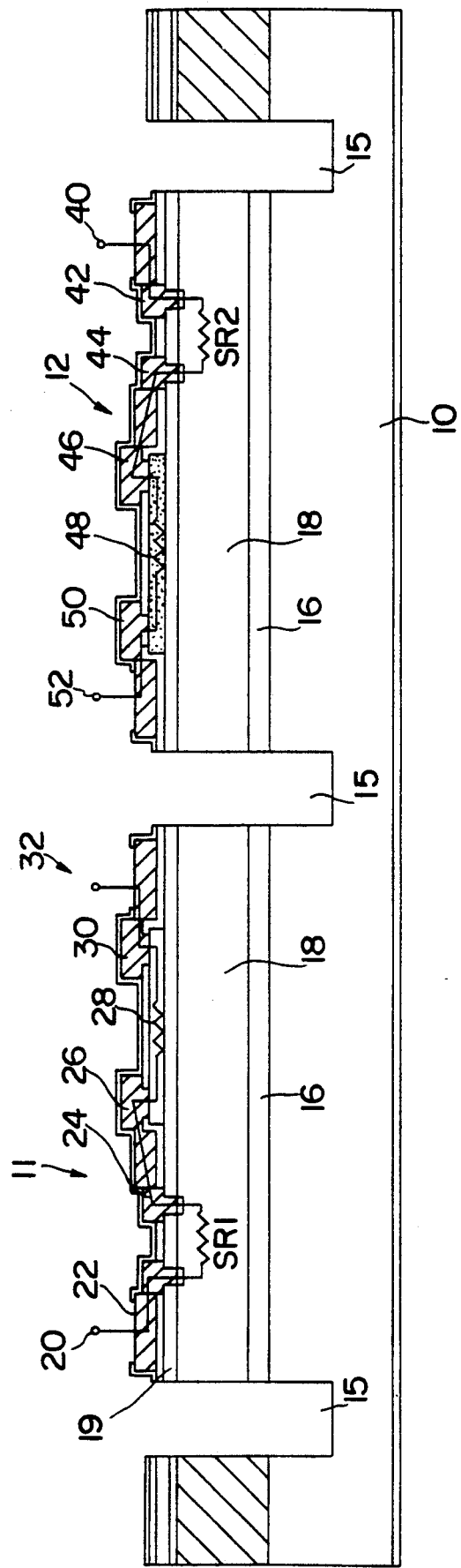
FIG. 1 is a cross-sectional view of an isolation test structure in accordance with the teachings of this invention.

Referring to FIG. 1, an isolation test structure in accord with the teachings of this invention is formed on a conventional substrate comprising p-type silicon wafer 10, n+ buffer layer 16 and n-type epitaxial layer 18. The test structure further comprises at least two devices 11 and 12 separated by isolation trenches 15, which completely surround each device. Although trenches 15 are shown in FIG. 1 as open spaces, the invention contemplates that trenches 15 may be back filled with a dielectric material such as undoped polysilicon, glass, polyimide and the like, whereby such levelized isolations can be quantitatively determined.

Referring further to FIG. 1, the device 11 comprises first substrate contact pad 20, which is in electrical contact with n-layer 18 through first substrate metalization 22 and is otherwise insulated from the substrate by insulating oxide 19. Also shown in FIG. 1 is substrate resistor SR1, which symbolically indicates the equivalent resistance of the substrate for later reference in connection with FIG. 2. Second substrate metalization 24, which is spaced apart from 22, makes a second contact to the substrate. First resistor metalization 26 provides electrical connection from the second substrate contact to one end of n-type polysilicon resistor 28. The other end of resistor 28 is contacted by metalization 30 and device is completed by second contact pad 32. Thus, a circuit comprising substrate contact pad 20, first substrate metalization 22, and equivalent substrate resistance SR1, second substrate metalization 24, first resistor metalization 26, polysilicon resistor 28, second resistor metalization 30 and resistor contact pad 32 in electrical series is formed on test device 11. Test device 12, which is formed identically to device 11 on wafer 10 and isolated by trenches 15 in accord with the teachings of this invention comprises a corresponding circuit having in series connection: substrate contact pad 40; substrate metalization 42; equivalent substrate resistance SR2; second substrate metalization 44; first resistor metalization 46; polysilicon resistor 48; second resistor metalization 50 and resistor contact pad 52.

Figure 2:
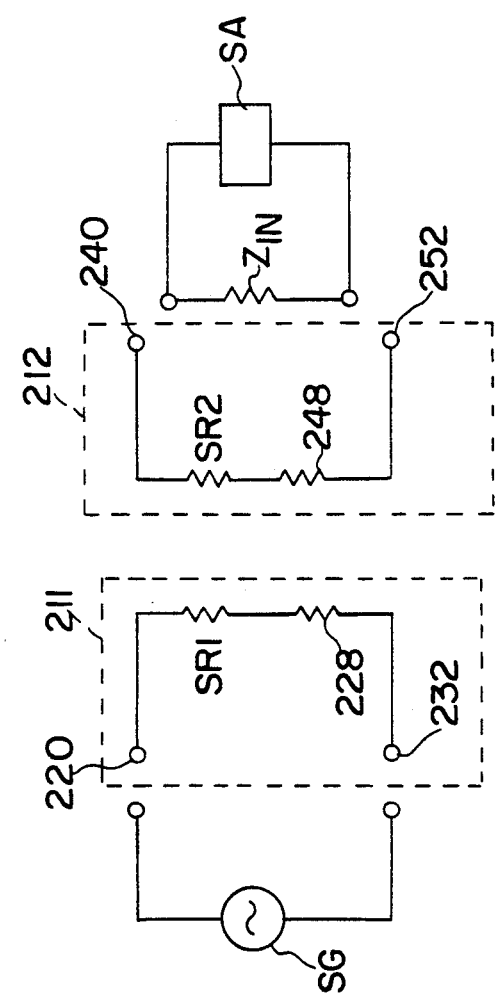
FIG. 2 is an equivalent circuit of the isolation test structure in accordance with the teachings of this invention.

Referring to the equivalent circuit of FIG. 2, signal generator SG is connected to device 211 at substrate contact 220 and resistor contact 232, which serve as inputs. Signal analyzer SA is connected to device 212 at its substrate contact 240 and resistor contact 252, which serve as outputs. Resistors 228 and 248, which correspond to resistors 28 and 48 in FIG. 1, are selected to match the output and input impedances of the signal generator and signal analyzer, respectively. In general, a value of 50 ohms, which is standard for high frequency devices is preferred. Other values, such as 75 ohms for cable television applications, may also be used. In any case, isolation between devices is quantitatively determined in accord with the teachings of this invention by applying an input signal from SG at a selected frequency to device 211 and the output at device 212 with SG and applying the known methods of analysis such as two port scatter parameter analysis. In practice, commercially available automatic network analyzers such as the model 8510 by Hewlett Packard can be employed to determine the precise value of isolation when used in conjunction with the structure and method of this invention.

Figure 3:
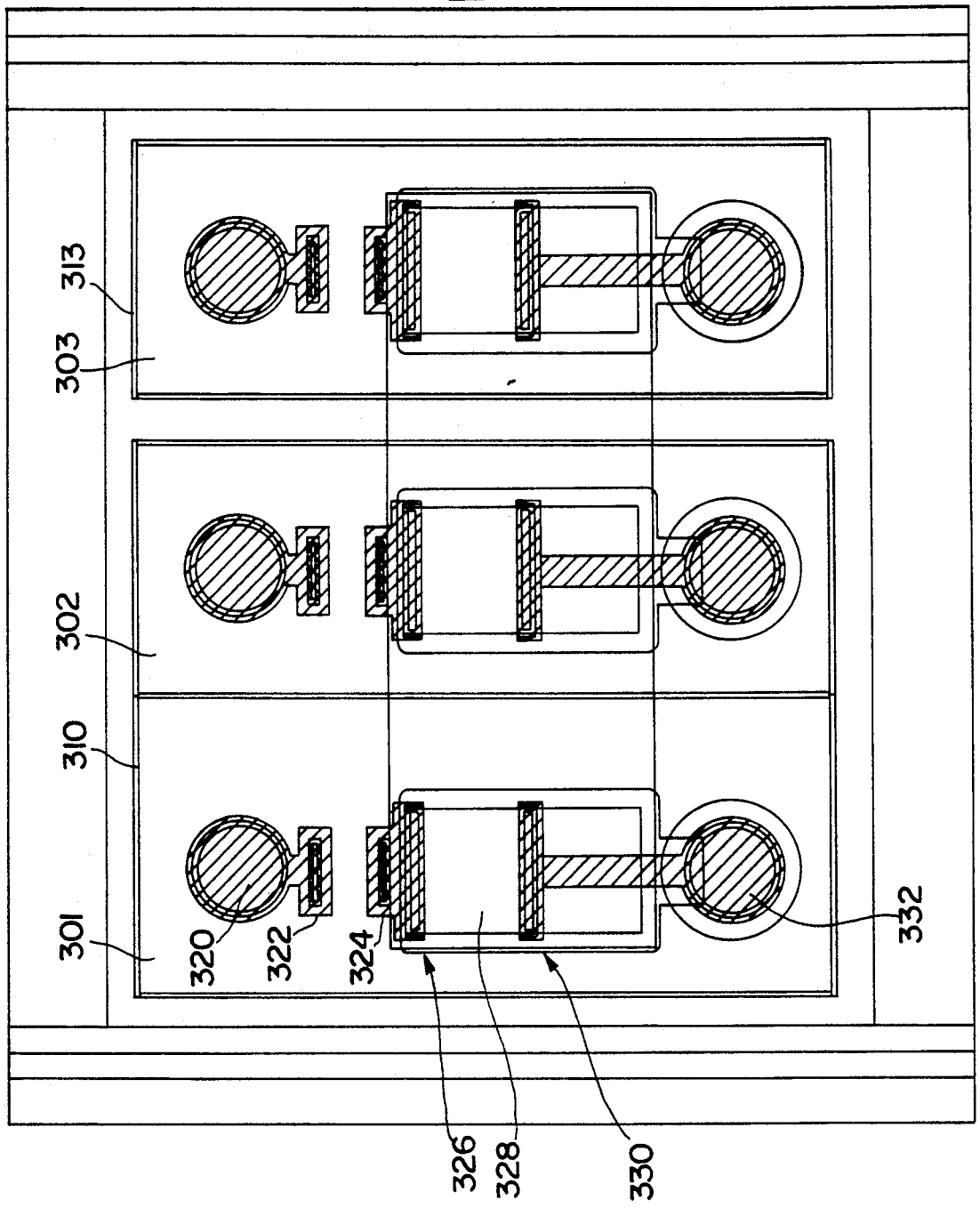
FIG. 3 is a plan view of the topography of an isolation test structure in accordance with the teachings of this invention.

FIG. 3 shows the topography of an exemplary implementation of this invention. Test devices 301 and 302 are isolated in this example by single trench 310. Also shown is device 303 which is isolated by a double trench, comprising 310 and 313. Bond pad 320 to device 311 corresponds to substrate contact 20 in FIG. 1. Substrate contacts 322 and 324 correspond to substrate metalizations 22 and 24 of FIG. 1. Resistor contacts 326 and 330, connected to opposite ends of resistor 328, and terminating at resistor bond pad 332, correspond to resistor metalizations 26 and 30 to resistor 28 and resistor contact 32 of FIG. 1. The essential elements of device 312 and device 12 of FIG. 1 correspond in the same way as the aforementioned relations between the elements of 311 in FIG. 3 and of 11 of FIG. 1. Furthermore, application of the teachings of this invention to determining other isolation techniques, such as double trenching as illustrated by device 313 in FIG. 3, should be apparent to those skilled in the art.

Moreover, in addition to aiding in design and improvement monolithic integrated circuit devices requiring effective isolation, one skilled in the art of semiconductor device fabrication can utilize the structure and methods of this invention to provide more effective wafer scale quality control in the manufacture of monolithic integrated circuit devices.

The structure and methods for quantitatively determining isolation are broadly applicable for the design and fabrication of isolation a variety of monolithic integrated circuit devices operating at frequencies ranging from DC to several GHz and utilizing compound semiconductor materials such as GaAs, InP and alloys thereof and including both analog and digital circuits.

What is claimed:

1. A test structure for determining electrical isolation between elements of a monolithic integrated circuit comprising:
   a first device and a second device formed on a semiconductor substrate, said first device separate from said second device, each device including in a single interconnection path and in passive monolithic electrical series connection:
   a) a first contact pad;
   b) a first substrate contact connecting said first contact pad to said substrate;
   c) a second substrate contact connected to said substrate;
   d) a first resistor contact connected to said second substrate contact;
   e) a matching resistor of preselected value having a first end connected to the first resistor contact;
   f) a second end of said matching resistor connected to a second resistor contact;
   g) a resistor contact pad connected to said second resistor contact;
   wherein said test structure is used for determining electrical isolation between a first portion of said substrate on which said first device is located and a second portion of said substrate on which said second device is located.

2. A method for determining electrical isolation between elements of a monolithic integrated circuit said method comprising the steps of:
   providing at least a first and second device formed on a semiconductor substrate, said first device separated from said second device, each device including in a single interconnection path and in passive monolithic electrical series connection:
   a) a first contact pad;
   b) a first substrate contact connecting said first contact pad to said substrate;
   c) a second substrate contact connected to said substrate;
   d) a first resistor contact connected to said second substrate contact;
   e) a matching resistor of reselected value having a first end connected to the first resistor contact;
   f) said matching resistor having a second end connected to a second resistor contact;
   g) a resistor contact pad connected to said second resistor contact;
   connecting the first contact pad and the resistor contact pad of the first device to a signal generator operating at a selected frequency; and
   connecting the first contact pad and the resistor contact pad of the second device to a signal analyzer and measuring the isolation between the first and second devices at the selected frequency by two port scatter parameter analysis.

3. The test structure of claim 2, wherein said signal generator and said signal analyze each have an impedance, and wherein:
   said matching resistor of said first circuit has an impedance matched to said impedance of said signal generator; and said matching resistor of said second circuit has an impedance matched to said impedance of said signal analyzer.

4. A test structure, for use with signal generator means for producing a signal and signal analyzer means for analyzing said signal, for determining electrical isolation between elements of a monolithic integrated circuit, said signal generator means and said signal analyzer means each having a first signal line and a second signal line, said test structure comprising:
   a first device formed on said semiconductor substrate, said first device including a first substrate portion and including in a single interconnection path and in passive monolithic electrical series connection:
   a) first contact means for coupling said signal generator means first signal line to said first substrate portion at a first location;
   b) first resistance means for providing a preselected resistance value, said first resistance means including a first terminal and a second terminal, said first resistance means first terminal coupled to said first substrate portion at a second location different from said first location;
   c) second contact means for coupling said signal generator means second signal line to said first resistance means second terminal;

a second device formed on said semiconductor substrate and separated from said first device, said second device including a second substrate portion and including in a further single interconnection path and in passive monolithic electric series connection:
 a) third contact means for coupling said signal analyzer means first signal line to said second substrate portion at a first location;
 b) second resistance means for providing a preselected resistance value, said second resistance means including a first terminal and a second terminal, said second resistance means first terminal coupled to said second substrate portion at a second location different from said first location;
 c) fourth contact means for coupling said signal analyzer means second signal line to said second resistance means second terminal;

wherein said test structure is used for determining electrical isolation between a first portion of said substrate on which said first device is located and a second portion of said substrate on which said second device is located.

* * * * *

UNITED STATES PATENT AND TRADEMARK OFFICE
CERTIFICATE OF CORRECTION

PATENT NO. : 5,254,941
DATED : October 19, 1993
INVENTOR(S) : David M. Osika

It is certified that error appears in the above-indentified patent and that said Letters Patent is hereby corrected as shown below:

On the Title Page, Item [54], the title of the invention should read --STRUCTURE AND METHOD FOR DETERMINING ISOLATION OF INTEGRATED CIRCUIT ELEMENTS--.

Column 4, lines 23-24, should read --e) a matching resistor of preselected value having a first end connected to the first resistor contace;--.

Signed and Sealed this

Tenth Day of May, 1994

Attest:

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 5,254,941
DATED : October 19, 1993
INVENTOR(S) : David M. Osika

It is certified that error appears in the above-indentified patent and that said Letters Patent is hereby corrected as shown below:

On the Title Page, Item [54] and column 1, lines 1-3 should read:
[54] STRUCTURE AND METHOD FOR DETERMINING ISOLATION OF INTEGRATED CIRCUIT ELEMENTS

Column 4, lines 23-24 should read:
    e) a matching resistor of preselected value having a first end connected to the first resistor contact;

This certificate supersedes Certificate of Correction issued May 10, 1994.

Signed and Sealed this

Eighth Day of November, 1994

Attest:

BRUCE LEHMAN

Attesting Officer

Commissioner of Patents and Trademarks